United States Patent
Katsuno et al.

(10) Patent No.: US 7,863,661 B2
(45) Date of Patent: Jan. 4, 2011

(54) SOLID-STATE IMAGING DEVICE AND CAMERA HAVING THE SAME

(75) Inventors: Motonari Katsuno, Kyoto (JP); Ryohei Miyagawa, Kyoto (JP); Hirohisa Ohtsuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 166 days.

(21) Appl. No.: 12/054,038

(22) Filed: Mar. 24, 2008

(65) Prior Publication Data
US 2008/0277702 A1  Nov. 13, 2008

(30) Foreign Application Priority Data
Mar. 26, 2007 (JP) ............................ 2007-080358

(51) Int. Cl.
*H01L 29/72* (2006.01)
(52) U.S. Cl. .................. 257/292; 257/293; 257/294; 257/258; 257/443; 348/311
(58) Field of Classification Search .......... 257/258, 257/292, 293, 294, 443; 348/311
See application file for complete search history.

(56) References Cited

U.S. PATENT DOCUMENTS

| | | | |
|---|---|---|---|
| 7,016,089 B2 | 3/2006 | Yoneda et al. | |
| 2006/0043442 A1* | 3/2006 | Yuzurihara et al. | .......... 257/292 |
| 2008/0018770 A1 | 1/2008 | Kato | |
| 2008/0024638 A1 | 1/2008 | Murakami | |
| 2008/0061216 A1 | 3/2008 | Kasuga et al. | |
| 2008/0074527 A1 | 3/2008 | Kato | |
| 2008/0079106 A1 | 4/2008 | Miyagawa et al. | |

FOREIGN PATENT DOCUMENTS

JP  2001-230400  8/2001

OTHER PUBLICATIONS

English languge Abstract of JP 2001-230400, Aug. 24, 2001.
* cited by examiner

*Primary Examiner*—Edward Wojciechowicz
(74) *Attorney, Agent, or Firm*—Greenblum & Bernstein P.L.C.

(57) ABSTRACT

Provided is a solid-state imaging device including unit pixels, wherein the unit pixels include two kinds of unit pixels including a first unit pixel and a second unit pixel that are formed on a common well on a semiconductor substrate. The first unit pixel includes: at least one photoelectric conversion region which converts light into a signal charge; the first semiconductor region that is formed on the common well and has a conductivity type identical to that of the common well; and the first contact electrically connected to the first semiconductor region. The second unit pixel includes: at least one photoelectric conversion region; the second semiconductor region that is formed on the common well and has a conductivity type opposite to that of the common well; and the second contact electrically connected to the second semiconductor region.

13 Claims, 13 Drawing Sheets

FIG. 2

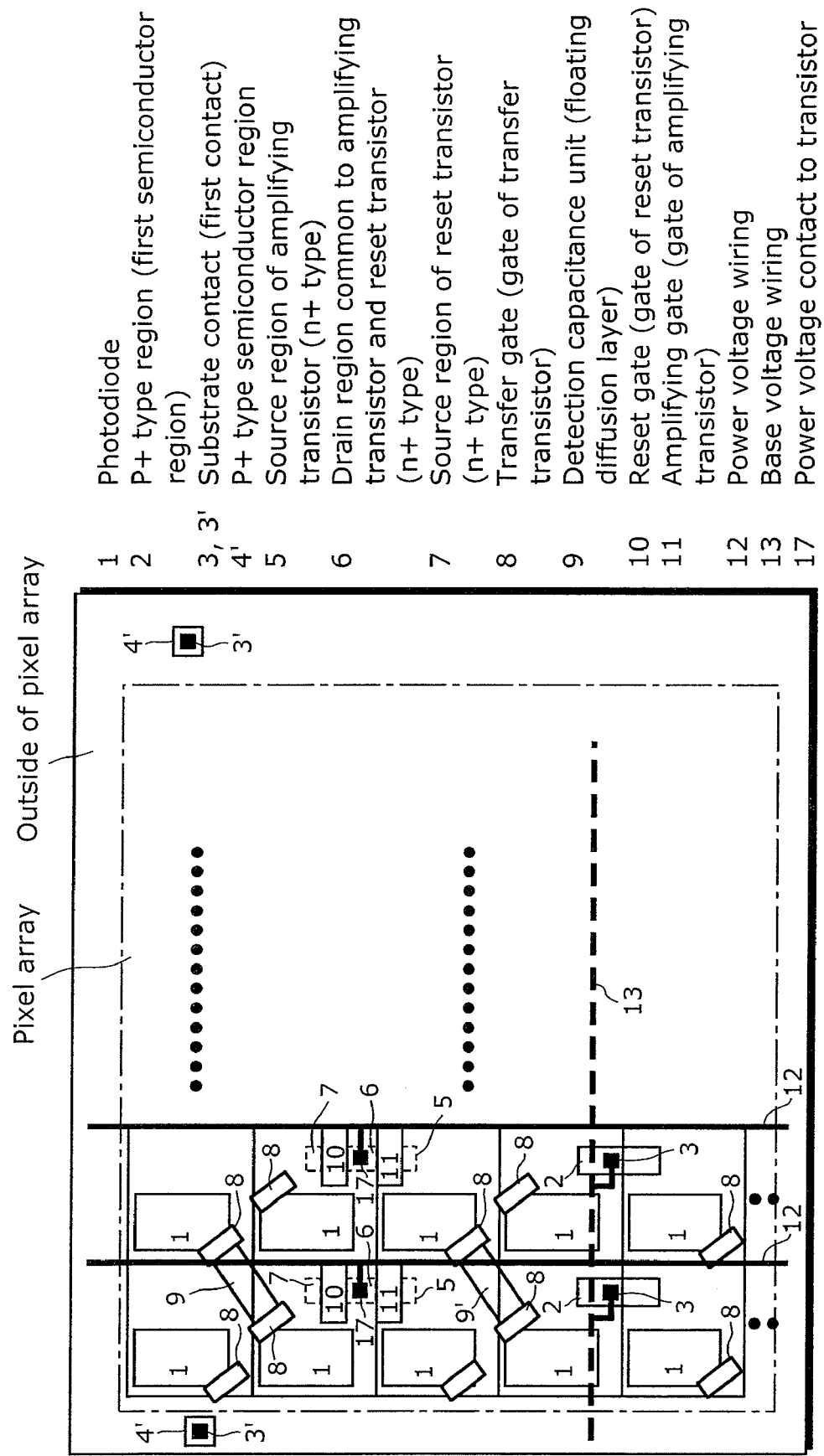

1  Photodiode
2  P+ type region (first semiconductor region)
3, 3'  Substrate contact (first contact)
4'  P+ type semiconductor region
5  Source region of amplifying transistor (n+ type)
6  Drain region common to amplifying transistor and reset transistor (n+ type)
7  Source region of reset transistor (n+ type)
8  Transfer gate (gate of transfer transistor)
9  Detection capacitance unit (floating diffusion layer)
10  Reset gate (gate of reset transistor)
11  Amplifying gate (gate of amplifying transistor)
12  Power voltage wiring
13  Base voltage wiring
17  Power voltage contact to transistor

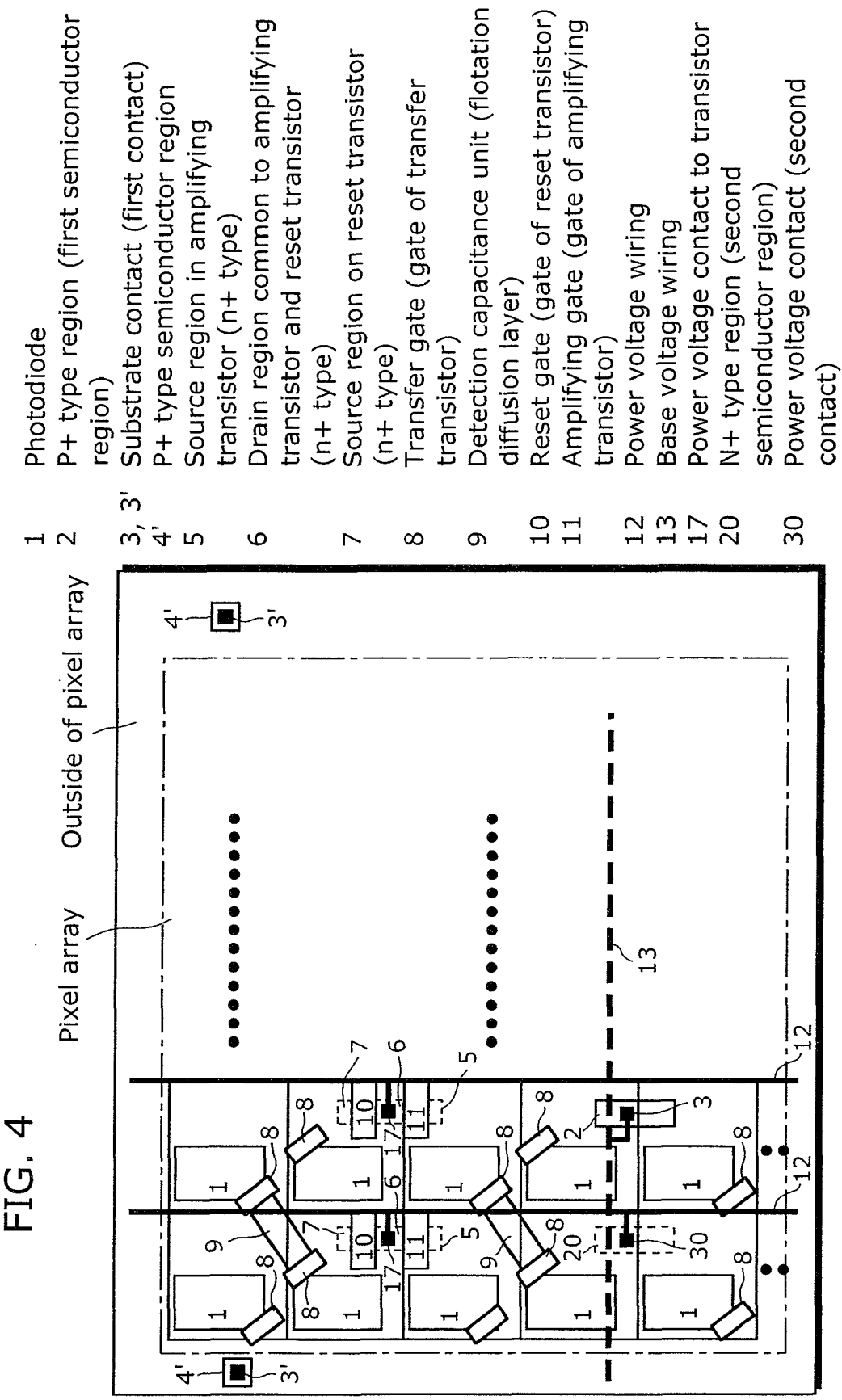

FIG. 4

1 Photodiode
2 P+ type region (first semiconductor region)
3, 3' Substrate contact (first contact)
4' P+ type semiconductor region
5 Source region in amplifying transistor (n+ type)
6 Drain region common to amplifying transistor and reset transistor (n+ type)
7 Source region on reset transistor (n+ type)
8 Transfer gate (gate of transfer transistor)
9 Detection capacitance unit (flotation diffusion layer)
10 Reset gate (gate of reset transistor)
11 Amplifying gate (gate of amplifying transistor)
12 Power voltage wiring
13 Base voltage wiring
17 Power voltage contact to transistor
20 N+ type region (second semiconductor region)
30 Power voltage contact (second contact)

| u2 | Structural unit |
| 17 | Power voltage contact to transistor |
| 20 | N+ type region (second semiconductor region) |
| 30 | Power voltage contact (second contact) |

| u1 | Structural unit |
| 2 | P+ type region (first semiconductor region) |
| 3 | Substrate contact (first contact) |
| 17 | Power voltage contact to transistor |
| 20 | N+ type region (second semiconductor region) |
| 30 | Power voltage contact (second contact) |

US 7,863,661 B2

SOLID-STATE IMAGING DEVICE AND CAMERA HAVING THE SAME

BACKGROUND OF THE INVENTION (1) Field of the Invention

The present invention relates to solid-state imaging devices, and particularly to a solid-state imaging device including a substrate contact and to a camera including the solid-state imaging device.

(2) Description of the Related Art

Charge Coupled Device (CCD) solid-state imaging devices and Metal Oxide Silicon (MOS) solid-state imaging devices are widely available as imaging devices for a digital still camera, a digital movie camera, and the like. Among such devices, each of the MOS solid-state imaging devices includes, on a single semiconductor substrate, an imaging region made up of imaging pixels and a peripheral circuit region that obtains a signal from each of the imaging pixels included in this imaging region.

Here, a conventional solid-state imaging device is to be described with reference to FIG. 1. FIG. 1 illustrates an entire structure of the solid-state imaging device having the conventional substrate contact which is described in Japanese Unexamined Patent Application Publication No. 2001-230400. This solid-state imaging device has a p-type common well formed on an n-type semiconductor substrate, and on this common well, a pixel array area PXA including pixels PXL that are two-dimensionally arranged and a peripheral portion PP in which a circuit for driving and the like is arranged are formed.

Each of the pixels PXL includes, on the semiconductor substrate, a photodiode 1, a p+ type semiconductor region 2, a transistor, and the like, and further, a substrate contact 3. The peripheral portion PP includes a p+ type semiconductor region 2' and a substrate contact 3'. The substrate contacts 3 and 3' are electrically connected to the p+ semiconductor regions 2 and 2', respectively.

Here, the reason why the substrate contact 3 is formed is to be described. Under transistors within a pixel PXL, the aforementioned p-type common well is formed so as to control a threshold of the transistors, and is connected to a base voltage (normally, 0V) so as to keep the voltage constant. However, in order to read an output signal from each of the pixels PXL, when turning amplifying transistors on and off in order, a potential of the common well varies with the capacitive coupling of the common well and a gate electrode of a selected transistor. Then, it takes finite lengths of time to reset the varying potential of the common well to the base potential. In the case where the substrate contact 3 is not formed within the pixel array area, since it is necessary to wait until the potential of the common well is reset to the base potential (0V) for operating the next-selected transistor, it becomes difficult to perform a high speed operation. In order to prevent such situation, conventionally, the substrate contact 3 is formed within the pixel array, and is connected to a wiring that connects to the base voltage. With this, it becomes possible to substantially reduce the time until the varying potential of the p-type common well is reset to the base potential.

However, there is a problem that a sensitivity difference among photodiodes each located in a different position occurs due to the pixel structure of the solid-state imaging device having the aforementioned substrate contact 3 within the pixel array area.

Using FIGS. 2 and 3A to 3C, the problem is to be described. FIG. 2 illustrates an example of a solid-state imaging device in which the sensitivity difference occurs among adjacent photodiodes.

The diagram illustrates an example of a case where a solid-state imaging device is composed of four pixels in one cell, in other words, a pair of an amplifying transistor and a reset transistor is arranged per four photodiodes 1. Furthermore, the diagram illustrates a part of the structure of the solid-state imaging device including: a photodiode 1; a gate 11 of an amplifying transistor; a source region 5 of the amplifying transistor; a gate 10 of a reset transistor; a source region 7 of the reset transistor; a drain region 6 common to the amplifying transistor and the reset transistor; a power voltage contact 17 which is connected to a power voltage wiring 12 and the drain region 6 and which supplies a power voltage to the pair of the amplifying transistor and the reset transistor; a gate 8 of a transfer transistor; a detection capacitance unit (floating diffusion layer) 9; a p+ type region 2; and a substrate contact 3.

There is a problem that the sensitivity difference occurs between the photodiode 1 that is the second (or third) one from the top and the photodiode 1 that is the fourth (or fifth) one from the top in the diagram.

This problem is described using FIGS. 3A to 3C. FIGS. 3A and 3B illustrate cross-sectional views of the photodiode 1 when an amplifying transistor or a reset transistor is adjacent to both sides of the photodiode 1. Although in FIG. 2, the power voltage contact 17 and the substrate contact 3 are not arranged on the same section including the photodiode 1, they are arranged on the same section in FIGS. 3A and 3C for the convenience of the description.

As illustrated in FIG. 3A, a collecting lens is placed above the photodiode 1. Then, incident light is collected onto the photodiode 1 through the collecting lens.

However, there are cases where incident light enters an element isolation unit 18 or the n+ type source region 7 (or 5), but does not enter the photodiode. When incident light enters the element isolation unit 18 or an n+ type source region, electrons are generated with a photoelectric conversion effect. A power voltage (normally, approximately 2 to 5 positive voltages) is applied to the n+ type source region 7 (or 5) for driving a transistor, and the generated electrons move to the power voltage side. For this reason, the electrons do not move to the photodiode side. In this case, the sensitivity of an adjacent photodiode 1 is not degraded.

As illustrated in FIG. 3C, when the photodiode 1 is adjacent to the p+ type regions 2 and incident light enters the element isolation unit 18 or the p+ type region 2, similarly, electrons are generated. The substrate contact 3 is formed on the p+ type region 2, and normally, the voltage is maintained at 0 voltage. Thus, the generated electrons move mainly to the photodiode 1, but not to the substrate contact 3. In this case, the sensitivity of the adjacent photodiode 1 is degraded.

Thus, in the conventional solid-state imaging device, a sensitivity difference (1 to 5%) occurs between a photodiode adjacent to an n-type region and a photodiode adjacent to a p-type region. In other words, sensitivity properties of photodiodes become different depending on a conductivity type in a semiconductor region adjacent to the photodiode. Accordingly, there is a problem that sensitivity inconsistency in an imaging area occurs.

The present invention has been conceived in view of the aforementioned problem, and the object is to provide the solid-state imaging device that includes a substrate contact and that reduces the sensitivity inconsistency between photodiodes and the sensitivity inconsistency in an imaging area.

SUMMARY OF THE INVENTION

In order to solve the aforementioned problem, the solid-state imaging device according to the present invention is a solid-state imaging device including unit pixels arranged in rows and columns on a semiconductor substrate, wherein the unit pixels include two kinds of unit pixels including a first unit pixel and a second unit pixel that are formed on a common well on the semiconductor substrate, the first unit pixel includes: at least one photoelectric conversion region which converts light into a signal charge; a first semiconductor region which is formed on the common well and which has a conductivity type identical to a conductivity type of the common well; and a first contact electrically connected to the first semiconductor region, and the second unit pixel includes: at least one photoelectric conversion region which converts light into a signal charge; a second semiconductor region which is formed on the common well and which has a conductivity type opposite to the conductivity type of the common well; and a second contact electrically connected to the second semiconductor region.

With this, it is possible to arrange the first semiconductor region in one of sides of the photoelectric conversion region and the second semiconductor region in the other side of the photoelectric conversion region by arranging the first unit pixel and the second unit pixel adjacently each other. In other words, the semiconductor regions each having a different conductivity type are arranged in both sides of the photoelectric conversion region. In this case, the number of electrons entering from the adjacent semiconductor region to the photoelectric conversion region becomes the half of the number of electrons entering thereto in the case where the n-type semiconductor regions are arranged in both sides of the photoelectric conversion region. With this, it becomes possible to reduce a sensitivity difference occurring depending on the placement of the photoelectric conversion region.

Here, the first contact may be connected to a wiring having a base voltage of the common well, and the second contact may be connected to a wiring having a positive voltage that is different from the base voltage. With this structure, it becomes further possible to reduce the time to recover from the variation of the common well with a combination of a voltage in the first contact and a voltage in the second contact.

Furthermore, the first unit pixel and the second unit pixel may be cyclically or randomly arranged. Here, the first unit pixel and the second unit pixel may be cyclically arranged in one of a column direction and a row direction. Here, the first unit pixel and the second unit pixel may be cyclically arranged in a column direction and in a row direction. With this structure, it becomes possible to reduce a sensitivity difference in the photoelectric conversion region and to reduce the sensitivity inconsistency occurring depending on the placement of the first unit pixel and the second unit pixel.

Here, the first semiconductor region may be a region in which p-type impurities are implanted, and the second semiconductor region may be a region in which n-type impurities are implanted. With this structure, it becomes possible to prevent both sides of the photoelectric conversion region from contacting the p+ type region and to reduce a sensitivity difference occurring depending on the placement of the photoelectric conversion region.

Here, at least one of the first unit pixel and the second unit pixel may further include an amplifying transistor that amplifies the signal charge and a reset transistor that resets the signal charge, the signal charge being converted by the photoelectric conversion region. Furthermore, the first unit pixel further may include at least one dummy wiring, the at least one dummy wiring may have a shape identical to one of a gate electrode of the amplifying transistor and a gate electrode of the reset transistor within the first unit pixel, and a relative position of the dummy wiring and the photoelectric conversion region within the first unit pixel may be identical to a relative position of one of the gate electrode of the amplifying transistor and the gate electrode of the reset transistor and the photoelectric conversion region within the first unit pixel. With this structure including a dummy wiring, it becomes possible to reduce variations of a reflection and a scattering of incident light to the photoelectric conversion region within the first unit pixel which are caused by the difference in the placement of a gate electrode and by the presence or absence of the gate electrode.

Here, the second unit pixel further may include at least one dummy wiring, the at least one dummy wiring may have a shape identical to one of a gate electrode of the amplifying transistor and a gate electrode of the reset transistor within the second unit pixel, and a relative position of the dummy wiring and the photoelectric conversion region within the first unit pixel may be identical to a relative position of one of the gate electrode of the amplifying transistor and the gate electrode of the reset transistor and the photoelectric conversion region within the first unit pixel. With this structure including a dummy wiring, it becomes possible to reduce variations of a reflection and a scattering of incident light to the photoelectric conversion region within the second unit pixel.

Here, the first unit pixel may further include two dummy wirings, each of the two dummy wirings may have a shape identical to a gate electrode of the amplifying transistor and a gate electrode of the reset transistor within the first unit pixel, a relative position of the two dummy wirings and the photoelectric conversion region within the first unit pixel may be identical to a relative position of the gate electrode of the amplifying transistor, the gate electrode of the reset transistor, and the photoelectric conversion region within the first unit pixel, the first semiconductor region may be arranged between the two dummy wirings, and the first unit pixel further may include: a first region which is adjacent to one of the two dummy wirings and is formed on the common well; a second region which is adjacent to the other one of the dummy wirings and is formed on the common well; a third contact electrically connected to the first region; and a fourth contact electrically connected to the second region. Furthermore, the first region and the second region may have a conductivity type opposite to the conductivity type of the first semiconductor region, and the third contact and the fourth contact may be electrically connected to the second contact. With this structure, it becomes possible to absorb the electrons generated in the p-type region (the first semiconductor region) connected to the first contact, in the third region connected to the third contact and in the fourth region connected to the fourth contact. With this, it becomes further possible to reduce the sensitivity difference between the photoelectric conversion regions.

Here, the first region and the second region may have a conductivity type identical to the conductivity type of the first semiconductor region, and the third contact and the fourth contact may be electrically connected to the first contact. Since an area occupancy percentage in which the first semiconductor region connected to the first, third, and fourth contacts, and the first region, and the second region occupy the first pixel unit can be minimal with this structure, it becomes possible to reduce the sensitivity difference between the pixels. Furthermore, since the third contact and the fourth contact substantially serve as the first contact, it becomes further possible to reduce the time to recover from the variation of the common well.

Here, the second unit pixel further may include two dummy wirings, each of the two dummy wirings may have a shape identical to a gate electrode of the amplifying transistor and a gate electrode of the reset transistor within the second unit pixel, a relative position of the two dummy wirings and the photoelectric conversion region within the second unit pixel may be identical to a relative position of one of the gate electrode of the amplifying transistor and the gate electrode of the reset transistor and the photoelectric conversion region within the second unit pixel, the second semiconductor region may be arranged between the two dummy wirings, the second unit pixel further may include: a first region which is adjacent to one of the two dummy wirings and is formed on the common well; a second region which is adjacent to the other one of the dummy wirings and is formed on the common well; a third contact electrically connected to the first region; and a fourth contact electrically connected to the second region, the first region and the second region may have a conductive type identical to the conductivity type of the first semiconductor region, and the third contact and the fourth contact may be electrically connected to the first contact. With this structure, it becomes possible to absorb the electrons generated in the p-type region connected to the first contact (the first semiconductor region), in the third region connected to the third contact and in the fourth region connected to the fourth contact. With this, it becomes further possible to reduce the sensitivity difference between the photoelectric conversion regions.

Furthermore, the solid-state imaging device according to the present invention may further include metal wiring layers, wherein at least one of the metal wiring layers includes a metal wiring arranged in an identical structure with respect to each of adjacent photoelectric conversion regions. Since with this structure, at least one of the metal wiring layers is arranged in an identical structure with respect to each of the photoelectric conversion regions, in addition to the aforementioned advantage, a reflection and a scattering of incident light to the photoelectric conversion regions which are caused by the metal wiring can be uniform without having the variations with respect to any of the photoelectric conversion regions. As a result, it becomes possible to reduce variations in sensitivity with respect to each of the photoelectric conversion regions.

Here, the metal wiring included in at least one of the metal wiring layers may include a metal wiring for supplying a power voltage and a metal wiring for reading a signal charge.

Here, at least one of the metal wiring layers may be a second layer or a layer higher than the second layer from a semiconductor substrate side. Since the metal wiring in the second layer or in one of the aforementioned layers easily causes a reflection and a scattering of incident light to the photoelectric conversion region rather than a metal wiring in other layers, this structure produces considerable advantage of making the reflection and scattering of incident light uniform.

Furthermore, the solid-state imaging device according to the present invention includes unit pixels arranged in rows and columns on a semiconductor substrate, wherein the unit pixels may be formed on a common well on the semiconductor substrate, each of the unit pixels may include: two or more photoelectric conversion regions each for converting light into a signal charge; an amplifying transistor that amplifies the signal charge and a reset transistor that resets the signal charge, the signal charge being converted by each of the photoelectric conversion regions; a power voltage contact which is electrically connected to a drain region of the amplifying transistor and of the reset transistor and which supplies a power voltage to the amplifying transistor and the reset transistor; a first semiconductor region which has a conductivity type identical to a conductivity type of the common well; and a first contact electrically connected to the first semiconductor region, and wherein at least one of metal wiring layers formed close to and above the drain region and the first semiconductor region may be arranged in an identical structure with respect to each of adjacent photoelectric conversion regions. Since with this structure, at least one of the metal wiring layers is arranged in an identical structure with respect to each of the photoelectric conversion regions in addition to the aforementioned advantage, a reflection and a scattering of incident light to the photoelectric conversion regions which are caused by the metal wiring can be uniform without having the variations with respect to any of the photoelectric conversion regions. As a result, it becomes possible to reduce variations in sensitivity with respect to each of the photoelectric conversion regions.

Here, the number of the metal wiring layers may be three or four, and a wiring included in one of the metal wiring layers may be a metal wiring in a second layer from a surface of the semiconductor substrate to an upward direction.

Here, an opening width of an opening provided above the photoelectric conversion region including a metal wiring of the at least one of metal wiring layers that is arranged in the identical structure is a smallest opening width, among opening widths of openings included in different metal wiring layers. Since the metal wiring in the second layer or in one of the aforementioned layers easily causes a reflection and a scattering of incident light to the photoelectric conversion region rather a metal wiring in other layers, this structure produces considerable advantage of making the reflection and scattering of incident light uniform.

Furthermore, since the camera of the present invention includes the aforementioned solid-state imaging device, the similar advantage can be obtained.

According to the solid-state imaging device of the present invention, it becomes possible to prevent the sensitivity from being lowered depending on the placement of the photoelectric conversion region. With this, it becomes possible to reduce a sensitivity difference between the photoelectric conversion regions.

FURTHER INFORMATION ABOUT TECHNICAL BACKGROUND TO THIS APPLICATION

The disclosure of Japanese Patent Application No. 2007-080358 filed on 26 Mar., 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2 illustrates an example of the solid-state imaging device in which a sensitivity difference occurs between adjacent photodiodes in the conventional technique.

FIG. 4 illustrates a structure of main units in the solid-state imaging device according to the first embodiment.

DESCRIPTION OF THE PREFERRED EMBODIMENTS

First Embodiment

Figure 1:
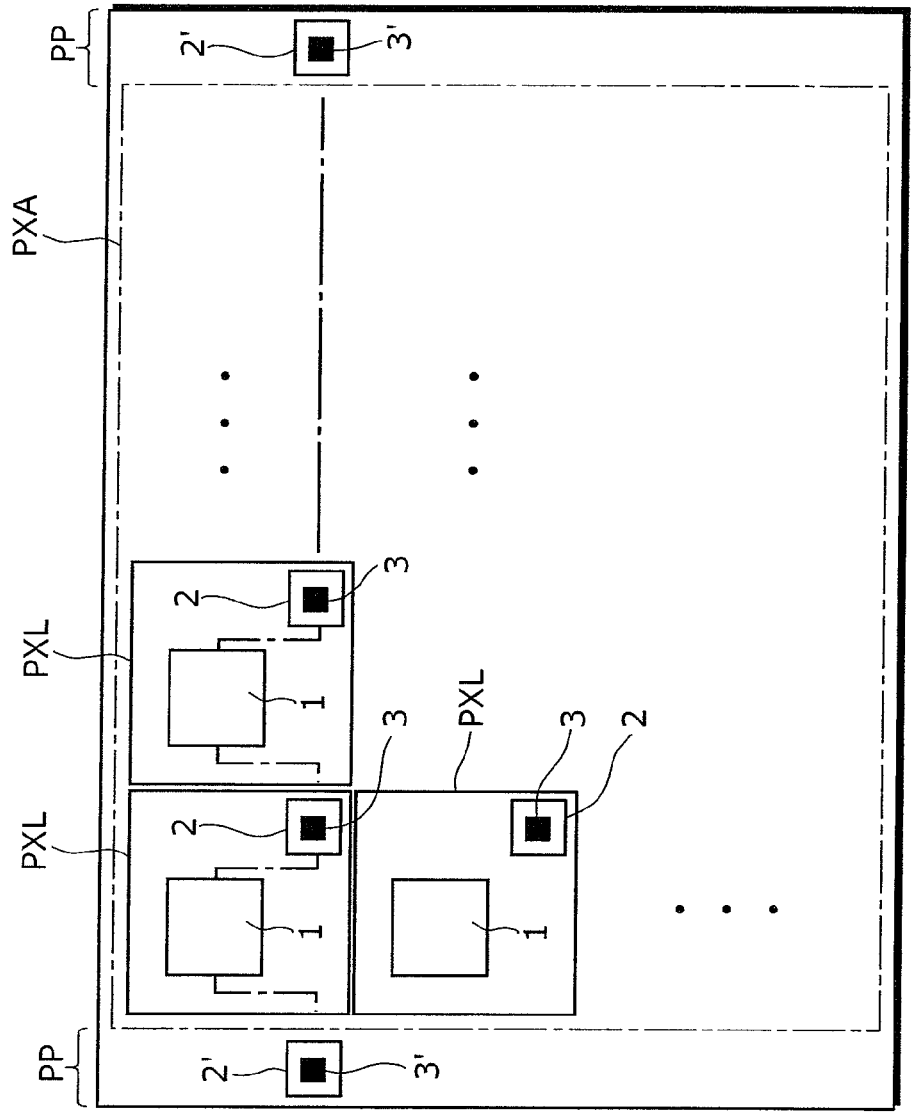
FIG. 1 is a schematic diagram illustrating the solid-state imaging device indicating necessity of a substrate contact in the conventional technique.
Figure 3A:
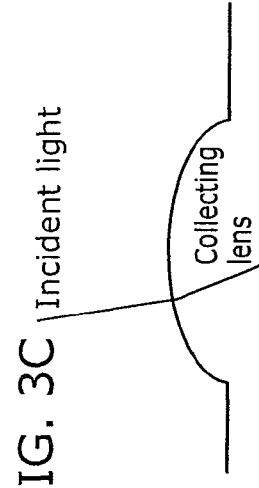
FIG. 3A illustrates a cross-sectional view of the photodiode in the case where n+ type regions are adjacent to both sides of the photodiode.
Figure 3B:
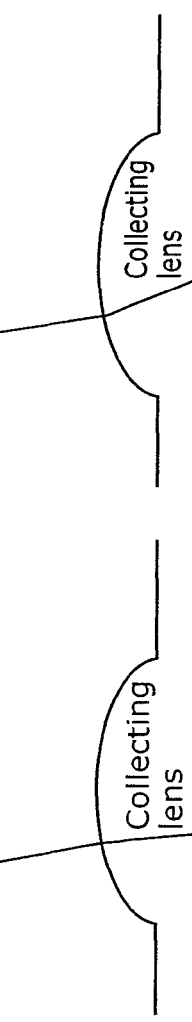
FIG. 3B illustrates a cross-sectional view of the photodiode in the case where n+ type regions are adjacent to both sides of the photodiode.
Figure 3C:
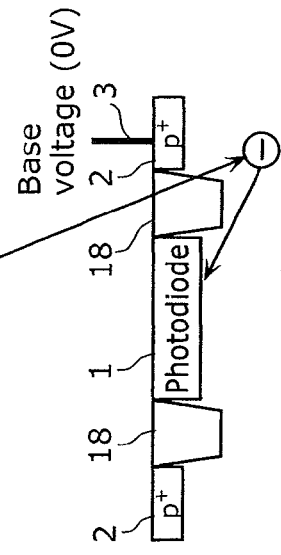
FIG. 3C illustrates a cross-sectional view of the photodiode in the case where p+ type regions are adjacent to both sides of the photodiode.

The solid-state imaging device in the first embodiment is formed above a common well on a semiconductor substrate and has unit pixels that are two-dimensionally arranged. The unit pixels include two types of unit pixels including the first unit pixel and the second unit pixel.

The first unit pixel includes: at least one photoelectric conversion region which converts light into a signal charge; the first semiconductor region that is formed on a common well and has a conductivity type (p+ type herein) identical to that of the common well; and the first contact electrically connected to the first semiconductor region. The first contact is similar to a conventional substrate contact, and is connected to a base voltage (normally 0V).

Furthermore, the second unit pixel includes: at least one photoelectric conversion region which converts light into a signal charge; the second semiconductor region that is formed on a common well and has a conductivity type (n+ type) opposite to that of the common well; and the second contact electrically connected to the second semiconductor region. The second contact is different from a conventional substrate contact, and is connected to a positive voltage, such as a power voltage.

As such, by providing both the first unit pixel and the second unit pixel, it is possible to arrange the first semiconductor region in one of sides of the photoelectric conversion region and the second semiconductor region in the other side of the photoelectric conversion region. In other words, in many cases, the semiconductor regions each having the opposite conductivity type are arranged in both sides of the photoelectric conversion region. When the semiconductor regions each having the opposite conductivity type are arranged in both sides of the photoelectric conversion region, the number of electrons entering from the adjacent semiconductor region to the photoelectric conversion region becomes a half of that of the number of electrons entering thereto in the case where the n-type semiconductor regions are arranged in the both sides of the photoelectric conversion region. With this, it becomes possible to reduce a sensitivity difference occurring depending on the placement of the photoelectric conversion region.

With reference to the diagrams, the solid-state imaging device according to the first embodiment of the present invention is to be described.

FIG. 4 illustrates a structure of main units in the solid-state imaging device according to the first embodiment of the present invention. This solid-state imaging device has a pixels-in-one-cell structure that is a structure made up of pixels in a single cell (a four-pixel-in-one-cell structure is applied herein as an example). In other words, the diagram illustrates a case where a pair of an amplifying transistor and a reset transistor is arranged per four photodiodes 1.

The diagram illustrates, as the structure of the pixel array unit of the solid-state imaging device, a photodiode (photoelectric conversion region) 1, a gate 11 of the amplifying transistor (referred to as amplifying gate), a source region 5 of the amplifying transistor, a gate 10 of the reset transistor (referred to as reset gate), a source region 7 of the reset transistor, a drain region 6 common to the amplifying transistor and the reset transistor, a power voltage contact 17, a gate 8 of the transfer transistor (referred to as transfer gate), a detecting capacitor unit (floating diffusion layer) 9, a p+ type region (the first semiconductor region) 2, a substrate contact (the first contact) 3, an n+ type region (the second semiconductor region) 20, and a power voltage contact (the second contact) 30.

One cell having a four-pixel-in-one-cell structure corresponds to, for example, the four photodiodes 1 that are located in the second row and the first column, in the first row and the second column, in the second row and the third column, and in the first row and the fourth column.

The aforementioned one cell includes: the photodiodes 1 that are formed on a semiconductor substrate; the transfer gates 8 that are arranged in a manner that diagonally crosses a part of the respective photodiodes 1; and the detecting capacitor unit (floating diffusion layer) 9 that accumulates a signal charge transferred from each of the transfer gates 8.

The power voltage contact 17 is connected to the power voltage wiring 12, and supplies a power voltage from the drain region 6 to the pair of the amplifying transistor and the reset transistor.

There are cases where the transfer gate 8 is extended as a wiring for electronically connecting pixels that are adjacent to each other and cases where the transfer gate 8 is connected using a contact and a metal wiring that is set above the transfer gate. Note using the metal wiring can lower the resistance in the wiring, so that the solid-state imaging device can further accelerate the operation (high-speed driving).

Furthermore, the substrate contact (the first contact) 3 is formed on the p+ type region (the first semiconductor region) 2 in which the same type of impurities as used in the p-type common well are implanted.

On the other hand, impurities having the conductivity type opposite to the p-type common well are implanted in the n+ type region (the second semiconductor region) 20. Furthermore, the power voltage contact 30 is formed on the n+ type region. In the four-pixel-in-one-cell structure illustrated in FIG. 4, the single substrate contact 3 and the single power voltage contact 30 are respectively arranged per eight photodiodes 1.

The details of the p+ type region (the first semiconductor region) 2 and the n+ type region (the second semiconductor region) 20 are to be described later.

Here, the signal charge accumulated in the photodiode 1 is transferred to the detecting capacitor unit 9 by turning on the transfer gate 8. The detecting capacitor unit 9 is connected to the source region 7 of the reset transistor and the gate 11 of the amplifying transistor. When turning on the reset transistor, the detecting capacitor unit 9 containing the signal charge is reset. Furthermore, by turning on the amplifying transistor after transferring the signal charge from the transfer transistor to the detecting capacitor unit 9, a voltage corresponding to the signal charge is outputted from the source of the amplifying transistor.

Thus, when a pair of an amplifying transistor and a reset transistor is commonly used for the photodiodes 1, it becomes possible to improve an area occupancy percentage in which the photodiodes occupy an area of one cell compared to an area occupancy percentage in the case where a pair of an amplifying transistor and a reset transistor is provided for one photodiode 1. Normally, the area occupancy percentage is increased approximately by 10 to 50 percentages. By increasing the area occupied by the photodiodes 1, it becomes possible to increase the number of electrons capable of being accumulated in the photodiode 1 and thus to improve the electron saturation amount and the sensitivity. With this, a higher-definition image can be obtained.

Note that an element isolation region is formed between adjacent pixels and between functional regions in a pixel. The element isolation region has a structure using a Shallow Trench Isolation (STI) process or a LOCOS (Local Oxidation of Silicon) process.

The transfer gate 8 is arranged in a diagonal direction with respect to the photodiode 1 in the solid-state imaging device of the first embodiment. This is because a motion of electrons (leakage) is reduced between the photodiode 1 and the detecting capacitor unit 9 when turning off the transfer gate 8, and a gate length of the transfer gate 8 is ensured to be a predetermined length or more. In the solid-state imaging device according to the first embodiment, such placement of the transfer gate 8 is for striking a balance between preventing leakage of electrons when turning off the transfer gate 8 and making the device finer.

Next, the placement of the power voltage contact 30 and the substrate contact 3 is to be described using FIG. 4.

The first semiconductor region 2 on which the substrate contact 3 is connected is formed normally as a p-type region that is of the same type as a common well. Furthermore, the second semiconductor region 20 on which the power voltage contact 30 is connected is formed as an n-type region having the conductivity type opposite to that of the first semiconductor region 2. Furthermore, the unit pixel (the second unit pixel) including the n-type second semiconductor region 20 having the conductivity type opposite to that of the first semiconductor region and the unit pixel (the first unit pixel) having the first semiconductor region 2 are cyclically or randomly arranged in the solid-state imaging device according to the first embodiment.

When the first and the second unit pixel are cyclically arranged, it is desirable that the first unit pixel and the second unit pixel are only arranged in one of a row direction and a column direction, and are arranged both in a row direction and a column direction cyclically.

Figure 5:
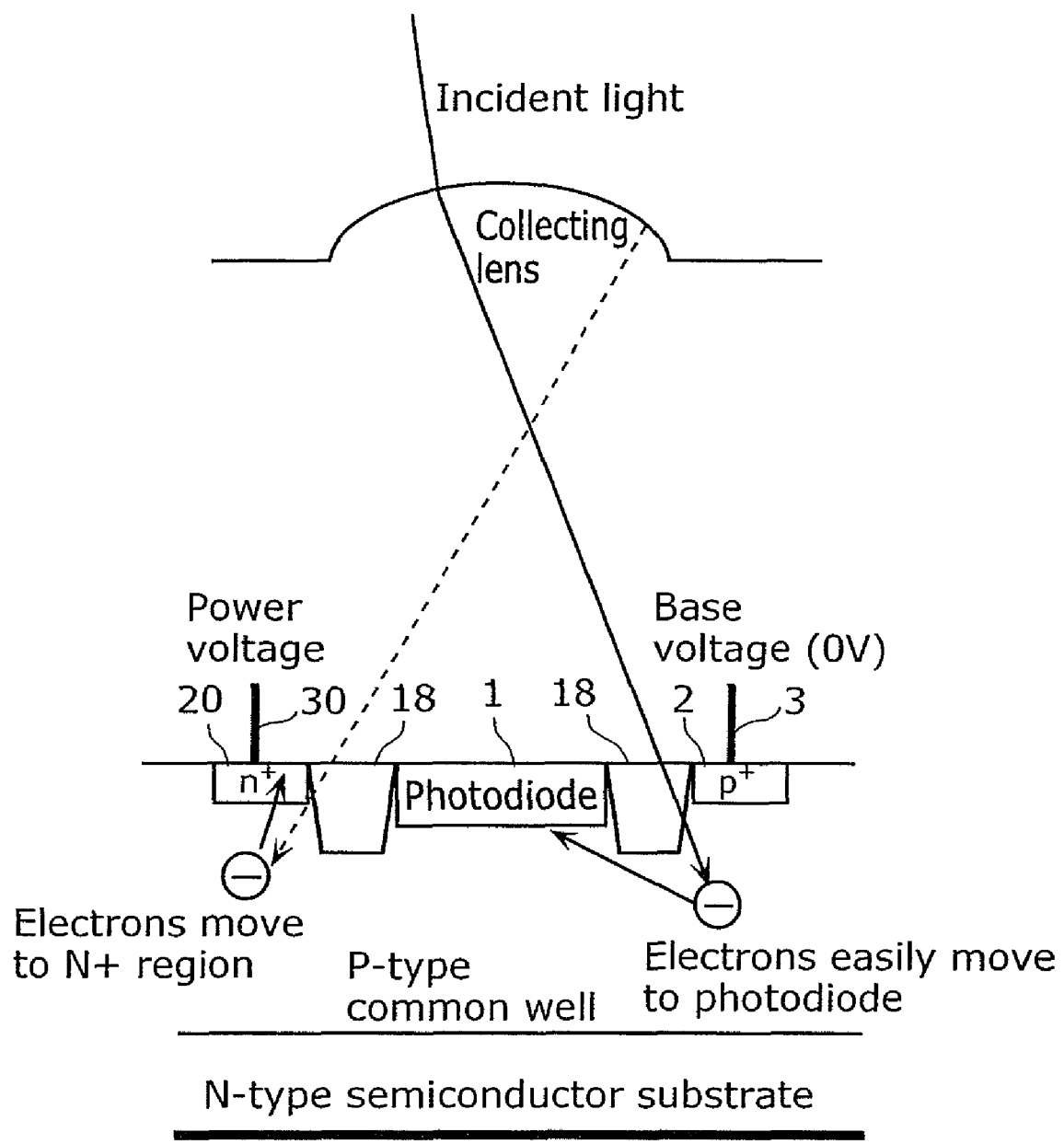
FIG. 5 illustrates a cross-sectional view of the photodiode in the case where an n+ type region and a p+ type region are adjacent to both sides of the photodiode.

First, the case where the first and the second unit pixel are cyclically arranged only in a row direction, in particular, the two-row cycle is to be described. In the two-row cycle, as illustrated in FIG. 5, the n-type second semiconductor region 20 and the p-type first semiconductor region 2 are adjacent to both sides of the photodiode 1. Thus, although the electrons generated in the n-type region do not move to the photodiode 1, the electrons generated in the p-type region move to the photodiode 1. In this case, the number of electrons entering from the adjacent semiconductor region to the photodiode 1 becomes a half of the number of electrons entering in the case where the n-type semiconductor regions are adjacent to both sides of the photodiode 1. Furthermore, when the first unit pixel is arranged at every ten rows, the number of electrons entering from the adjacent semiconductor region to the photodiode becomes one tenth of the number of electrons in the aforementioned case.

Normally, although the number of electrons accumulated in a photodiode ranges from 1,000 to 50,000, the number of electrons entering from the adjacent semiconductor region to the photodiode can be reduced approximately to 100, and even to 10 or less at the minimum. Thus, an influence of the number of electrons entering from the adjacent semiconductor region to the photodiode is limited to 1 percentage or less, and thus, the influence on the sensitivity output extremely becomes small. Accordingly, a preferable image can be obtained.

Note that the first unit pixel and the second unit pixel may correspond to the aforementioned cell made up of pixels and may not necessarily correspond to the cell. For example, the first unit pixel or the second unit pixel may be a set of pixels rectangularly arranged, such as a set of: (a) four pixels in a cell; (b) four pixels rectangularly adjacent at the left, right, top and the bottom in FIG. 4; and (c) eight pixels rectangularly adjacent at the left, right, top and the bottom in FIG. 4 (2 rows×4 columns or 4 rows×2 columns).

Furthermore, when the solid-state imaging device has a pixel-in-one-cell structure that is different from the one in FIG. 4, the first unit pixel and the second unit pixel may correspond to a cell (in other words, a pixel) or may include pixels.

In other words, the first unit pixel has only to include one or more of the photodiodes 1, the first semiconductor region (p+ type semiconductor region) 2, and the first contact (substrate contact 3). Furthermore, the second unit pixel has only to include one or more of the photodiodes 1, the second semiconductor region (n+ type semiconductor region) 20, and the second contact (power voltage contact 30).

Figure 6B:
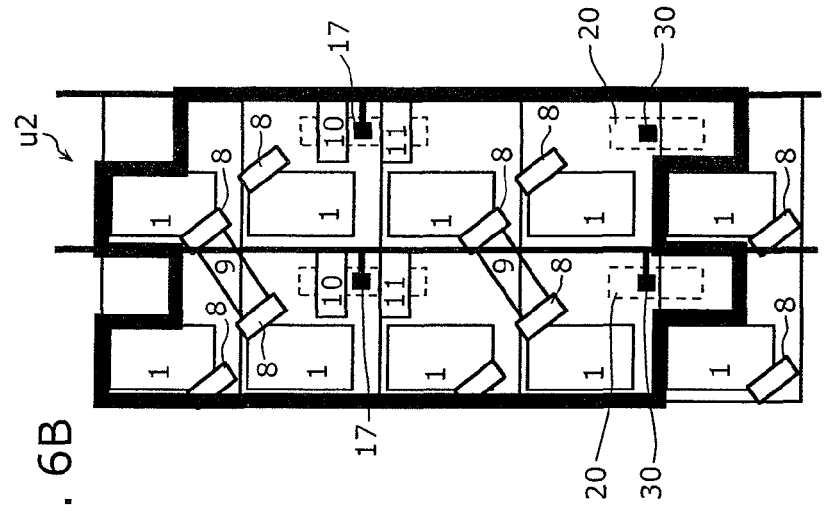
FIG. 6B illustrates a structure unit u2 as an example of the second unit pixel.
Figure 6A:
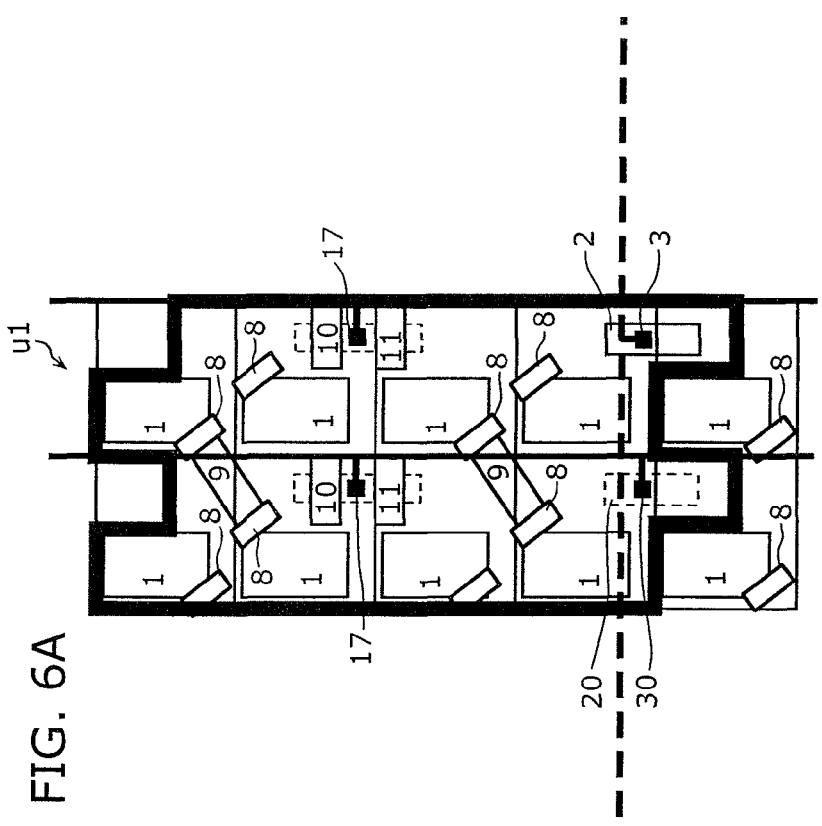
FIG. 6A illustrates a structure unit u1 as an example of the first unit pixel.
Figure 7:
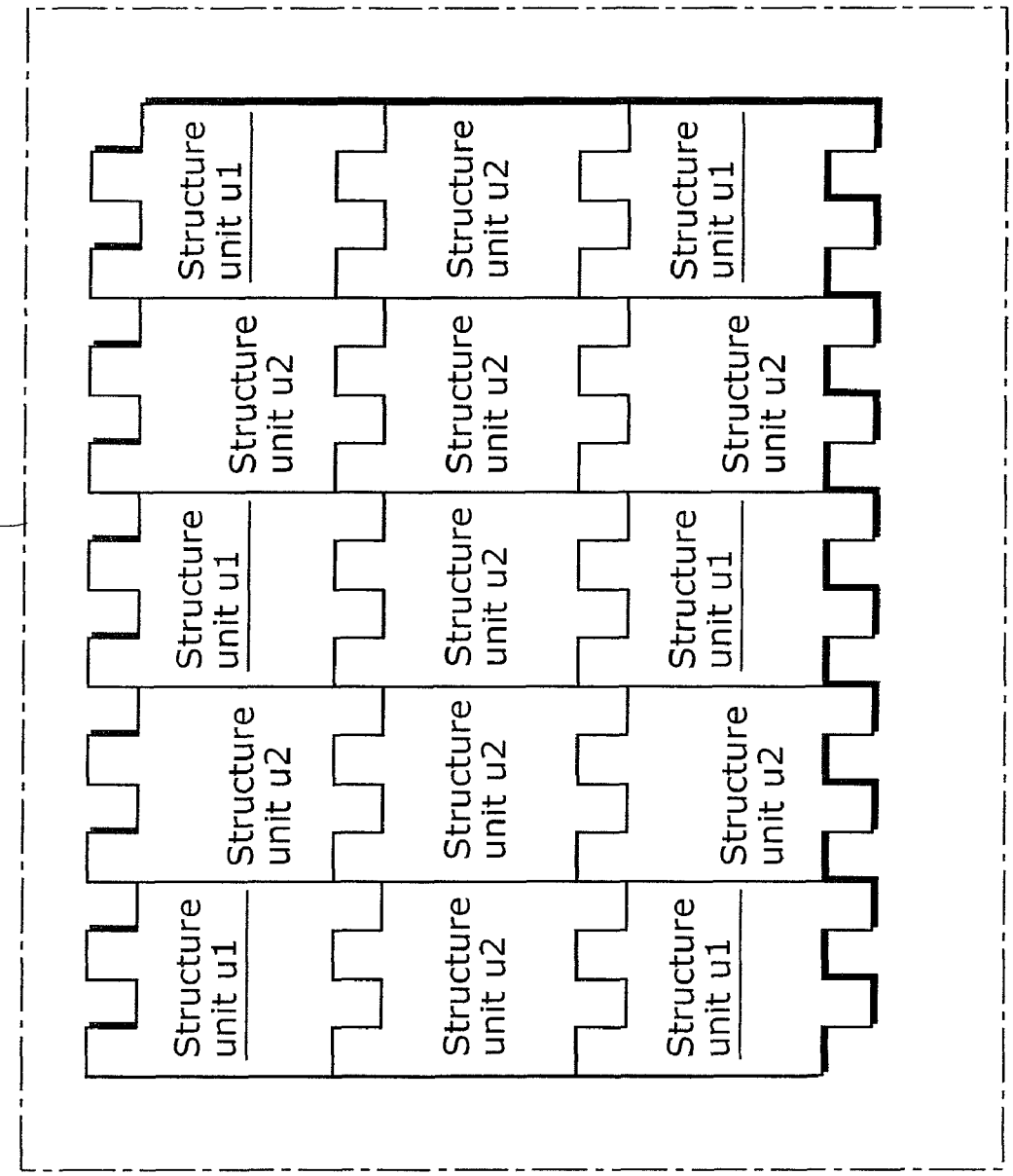
FIG. 7 illustrates an example of the placement of the structural units u1 and the structural units u2.

Next, a case where unit pixels are cyclically arranged not only in a row direction, but also in a row direction and in a column direction is described using FIGS. 6A, 6B, and 7.

FIGS. 6A and 6B illustrate examples of the first unit pixel and the second unit pixel, respectively.

A structural unit u1 indicated by a bold line within FIG. 6A is one of the examples of the first unit pixel, and includes eight pixels (photodiode 1), the p+ type first semiconductor region 2, the substrate contact 3, and further, the power voltage contact 30.

A structural unit u2 indicated by a bold line within FIG. 6B is one of the examples of the second unit pixel, and includes eight pixels (photodiode 1), and two sets of the n+ type second semiconductor region 20 and the power voltage contact 30 but does not include the substrate contact 3.

As such, the structural unit u1 has a structure in which a substrate contact is formed per eight photodiodes. On the other hand, the structural unit u2 has a structure in which the n+ type second semiconductor region 20 is formed in which an ion species that has a conductivity type opposite to that of the p-type common well is implanted and furthermore, the power voltage contact 30 is formed thereon.

FIG. 7 illustrates an example of the placement of the structural units u1 and the structural units u2 which are cyclically arranged in both the row direction and column direction. As illustrated in the diagram, by cyclically arranging the units in both the row direction and column direction, it becomes possible to reduce a ratio of photodiodes in which the sensitivity is deteriorated to all of the photodiodes included in a pixel array, with a phenomenon that electrons caused by angular light move to a adjacent photodiode.

Note that in the solid-state imaging device according to the first embodiment of the present invention, as long as one of pixels including the substrate contact 3 is included in photodiodes that are arranged in approximately 50 rows×50 columns, it becomes possible to prevent the high-speed operation from being degraded for the time period when the p-type common well varies until it is recovered, and to sufficiently prevent variations of the pixel sensitivity in photodiodes from occurring.

Note that normally, the substrate contact 3 has only to be included in 10 rows×10 columns to in 100 rows×100 columns.

Note that in the solid-state imaging device according to the first embodiment of the present invention, the effects of reducing the variations in sensitivity can be larger by arranging the structure units in a column and a row direction.

Second Embodiment

Compared to the solid-state imaging device in the first embodiment, a gate electrode and a dummy wiring that have the same shape and are made of the same material as the gate electrode are provided in the second embodiment. With such additional elements, the second embodiment describes the solid-state imaging device that reduces variations of a reflection and a scattering of incident light entering a photodiode which are caused by a difference in the placement of a gate electrode or the presence or absence of the gate electrode and that reduces the number of the generated electrons caused by angular light. Here, the dummy wirings have the same shape as those of the amplifying gate 11 and the reset gate 10, and the dummy wirings are formed so that a relative position of the dummy wiring and the photodiode is the same as a relative position of the amplifying gate 11, the reset gate 10, and the photodiode.

With reference to the diagrams, the solid-state imaging device according to the second embodiment of the present invention is to be described.

Figure 8:
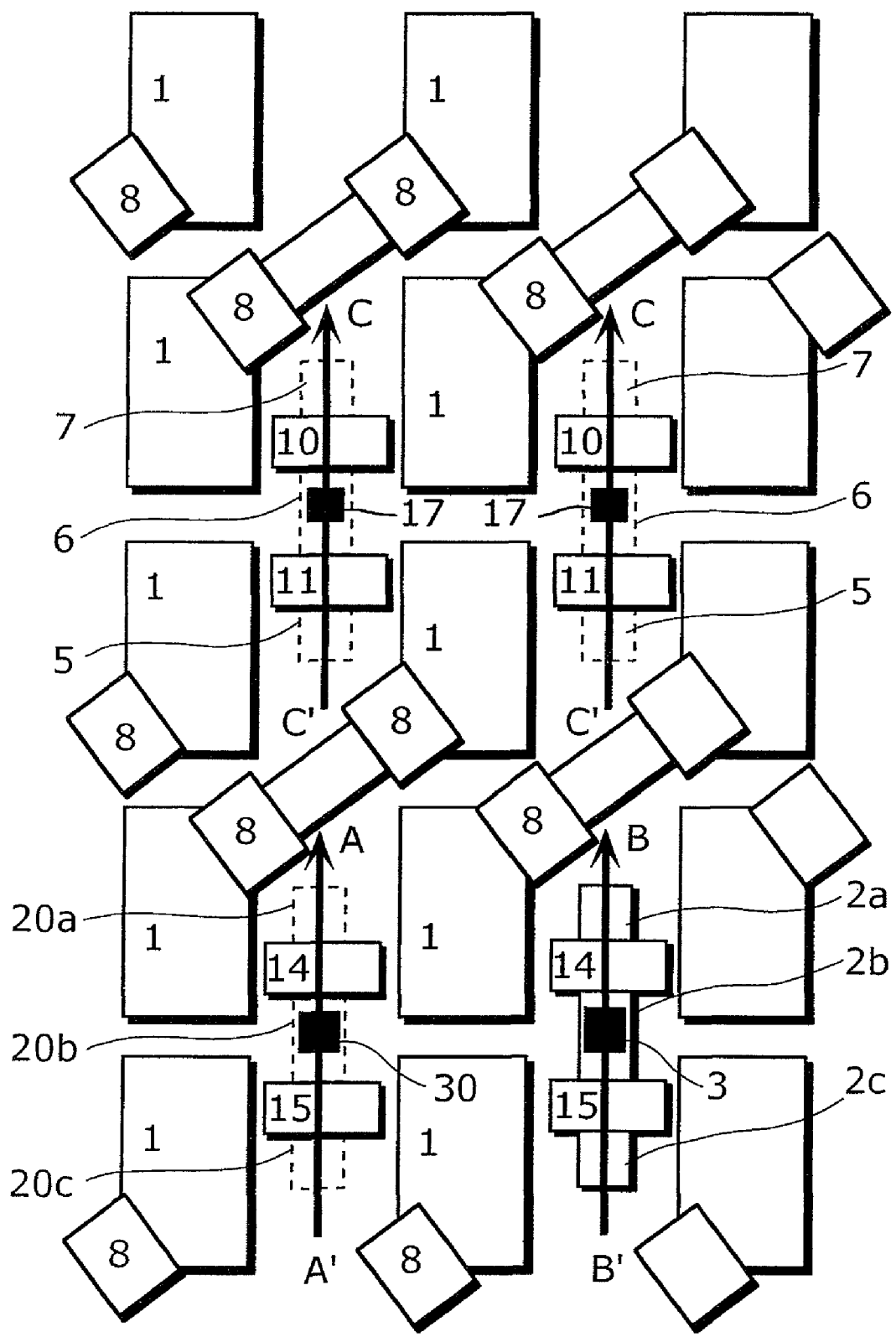
FIG. 8 illustrates a structure of main units in the solid-state imaging device according to the second embodiment.

FIG. 8 illustrates a structure of main units in the solid-state imaging device according to the second embodiment of the present invention. The solid-state imaging device in the diagram is different from the solid-state imaging device in FIG. 4 in having: dummy wirings 14 and 15 on the first semiconductor region 2 and the second semiconductor region 20; a p+ type region 2a, a first semiconductor region 2b, and a p+ type region 2c instead of the first semiconductor region 2; and an n+ type region 20a, a second semiconductor region 20b, and an n+ type region 20c instead of the second semiconductor region 20. The following mainly describes the different points other than the same points as in the aforementioned description for FIG. 4.

The dummy wirings 14 and 15 have the same shape and are made of the same material as those of the reset gate 10 and the amplifying gate 11, and are arranged in the same position relative to the photodiode.

Since an ion species is not implanted immediately under the dummy wirings 14 and 15, three small regions, namely, the p+ type region 2a, the first semiconductor region 2b, and the p+ type region 2c are formed instead of the first semiconductor region 2. Similarly, three small regions, namely, the n+ type region 20a, the second semiconductor region 20b, and the n+ type region 20c are formed instead of the second semiconductor region 20.

Next, with reference to FIGS. 9A to 9E, the solid-state imaging device according to the second embodiment of the present invention is to be described in details.

Figure 9A:
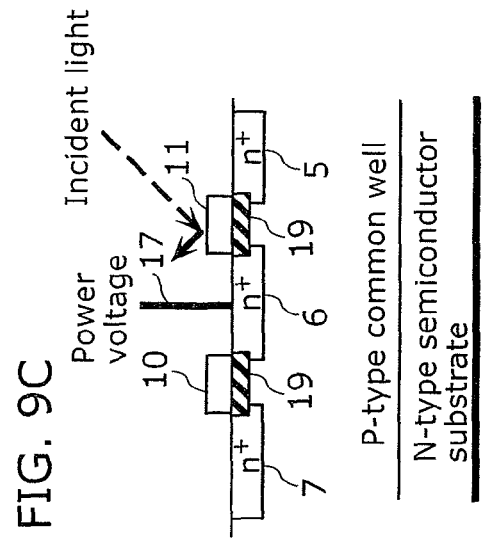
FIG. 9A is a schematic diagram illustrating a Section A-A' in FIG. 8.
Figure 9B:
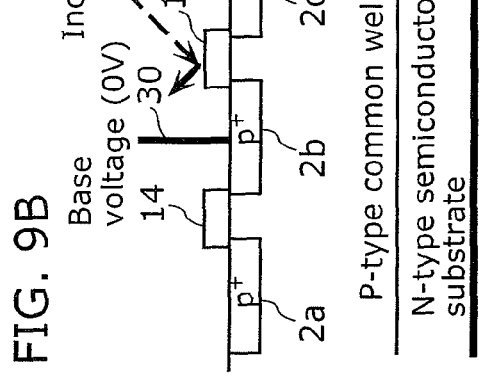
FIG. 9B is a schematic diagram illustrating a Section B-B' in FIG. 8.
Figure 9C:
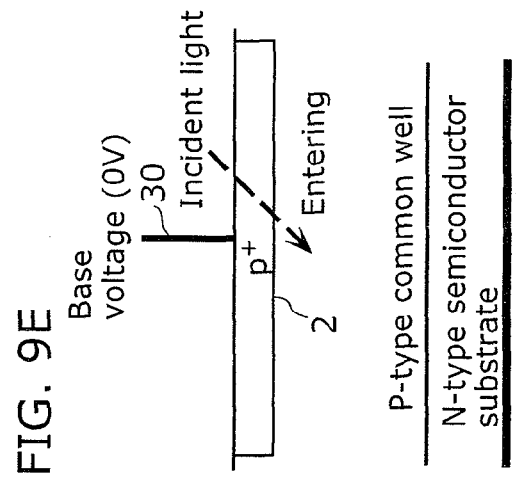
FIG. 9C is a schematic diagram illustrating a Section C-C' in FIG. 8.

FIGS. 9A to 9C are cross-sectional views of the solid-state imaging device in the case where a dummy wiring is formed. FIG. 9A is a schematic diagram illustrating a Section A-A' in FIG. 8. FIG. 9B is a schematic diagram illustrating a Section B-B' in FIG. 8. FIG. 9C is a schematic diagram illustrating a Section C-C' in FIG. 8.

Figure 9D:
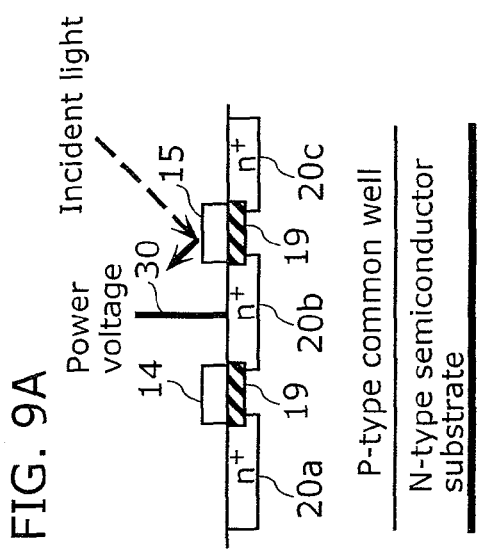
FIG. 9D is a schematic diagram illustrating a section corresponding to FIG. 9A in the case where a dummy wiring is not formed.
Figure 9E:
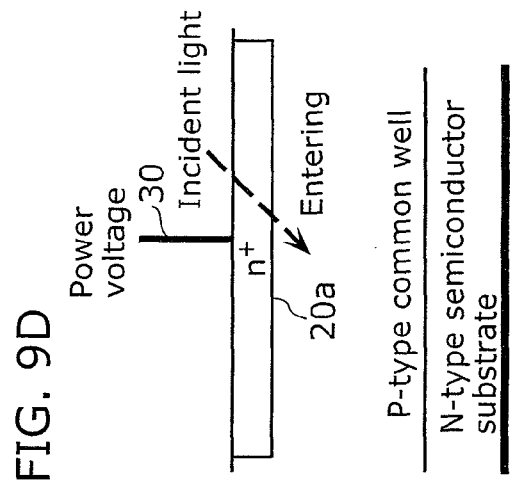
FIG. 9E is a schematic diagram illustrating a section corresponding to FIG. 9B in the case where a dummy wiring is not formed.

FIGS. 9D and 9E are cross-sectional views of the solid-state imaging device in the case where a dummy wiring is not formed (FIG. 4). FIG. 9D is a schematic diagram illustrating a section corresponding to FIG. 9A, in the case where a dummy wiring is not formed (FIG. 4). FIG. 9E is a schematic diagram illustrating a section corresponding to FIG. 9B, in the case where a dummy wiring is not formed (FIG. 4).

A solid-state imaging device is designed so as to collect light to a photodiode at a maximum through a collecting lens. However, there are cases where light leaks to the semiconductor regions 7, 2, and 20 in FIG. 8 without collecting light to the photodiode. Note that generally, an amount of leakage light is approximately 5 to 10% of the total amount of incident light.

As illustrated in FIG. 9C, there are cases where light is reflected from a gate electrode, and part of light is directed toward the photodiode in the semiconductor regions 5 to 7. When the is dummy wiring is not arranged, as illustrated in FIGS. 9D and 9E, the way light reflects differs between the second semiconductor region 20 and the first semiconductor region 2, and light is absorbed inside the substrate. Thus, in a pixel of the photodiode adjacent to the second semiconductor region 20, the sensitivity varies, compared to a pixel in other than the region.

However, as illustrated in FIGS. 9A to 9C, a dummy wiring is arranged in the solid-state imaging device according to the second embodiment of the present invention so as to make the way the leakage light reflects (in other words, a light path) identical to a way leakage light reflects on the semiconductor regions 5 to 7 each including a gate electrode. Furthermore, with a reflection and a scattering of incident light that are caused by a difference in a structure of the dummy wirings 14 and 15 and the gate electrodes 10 and 11, an amount of light entering each photodiode can be made identical to each other.

More specifically, as illustrated in FIGS. 9A and 9B, with the formation of a dummy wiring, it becomes possible to make the way light scatters and reflects identical outside of the photodiode region, regardless of whether a region adjacent to each photodiode is a region for a reset transistor, a region for an amplifying transistor, or a region in which a contact is formed.

To sum up, with the formation of a dummy wiring, it becomes possible to make a light scattering and a light reflection identical in each pixel. Furthermore, it becomes possible to form a dummy wiring in the same manufacturing process for forming the gate electrodes 10 and 11. In other words, without increasing the number of processes, it becomes possible to obtain uniformity in sensitivity between pixels in a very effective manner.

Furthermore, when forming a dummy wiring in the second semiconductor region (FIG. 9A) in which a power voltage contact is formed, it becomes possible to make a potential in the second semiconductor region entirely identical by introducing n+ ionized impurities in a source/drain region and further by introducing n-type impurities under the dummy wiring 14. With this, the potential becomes a floating situation in a region which is separated by a dummy wiring, and thus, it becomes possible to prevent noise from occurring from the region.

Third Embodiment

In the third embodiment, the solid-state imaging device in which the n+ type regions 20a and 20c are formed instead of the p+ type regions 2a and 2c and further the power voltage contact 30 is added to the n+ type regions 20a and 20c is to be described, compared to the solid-state imaging device according to the second embodiment. With this, it becomes possible to absorb electrons generated in the p+ type region under the substrate contact 3, in the power voltage contact 30.

Figure 10:
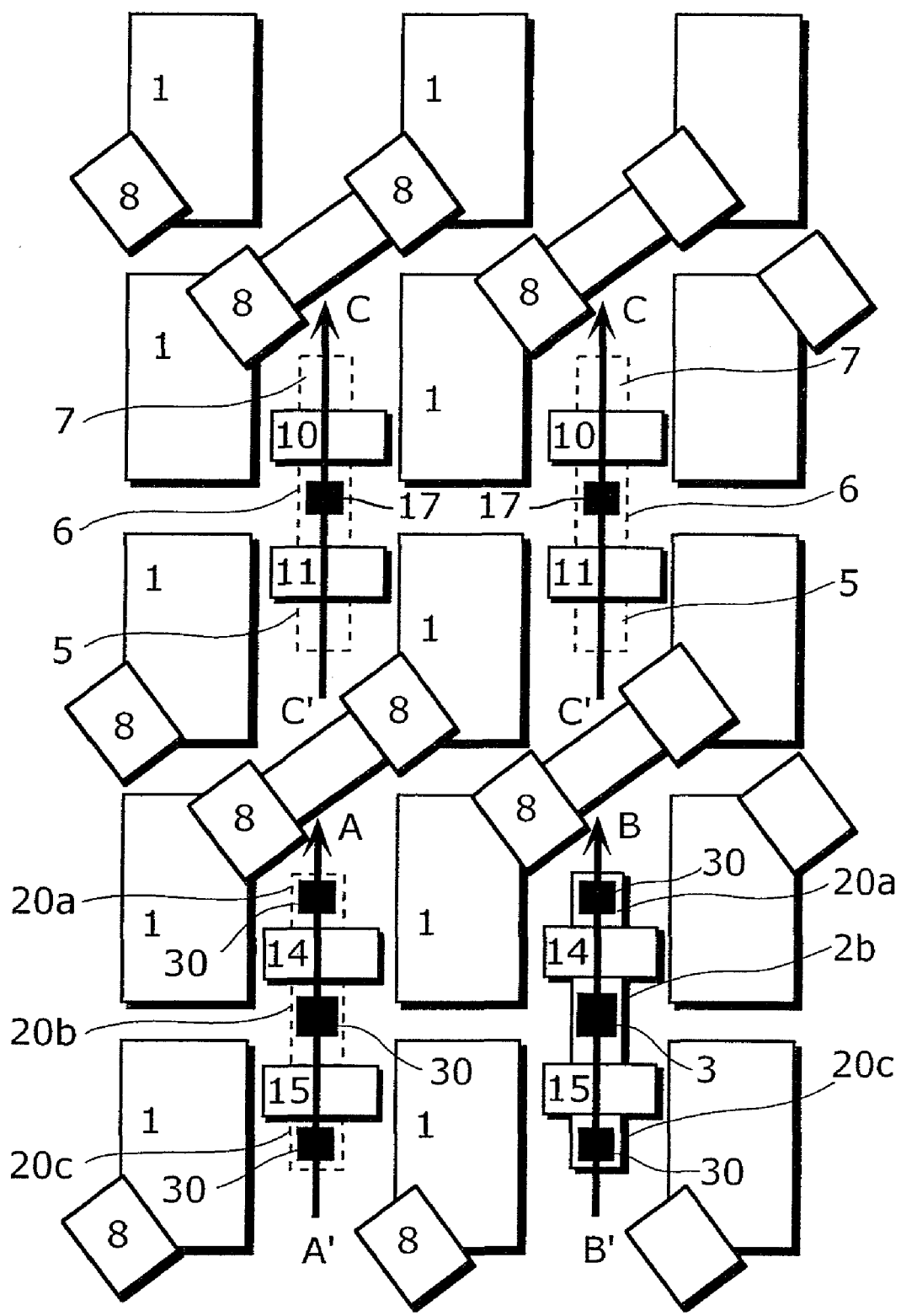
FIG. 10 illustrates a structure of main units in the solid-state imaging device according to the third embodiment.

FIG. 10 illustrates a structure of main units in the solid-state imaging device according to the third embodiment. The diagram is different from the solid-state imaging device according to the second embodiment (FIG. 8) in that the n+ type regions 20a and 20c are formed instead of the p+ type region 2a and 2c and further that the power voltage contacts connected to the n+ type regions 20a and 20c are added. The following mainly describes the different points other than the same points as in the aforementioned description for FIG. 8.

The way the n+ type regions 20a and 20c are formed instead of the p+ type regions 2a and 2c is that, in manufacturing processes, the p+ type implanting region is formed only in a region in which the substrate contact 3 sandwiched by the dummy wirings 14 and 15 is to be formed and that in a region other than a region that sandwiches the dummy wirings 14 and 15, an n+ type ion species is implanted so as to form an n+ type region. The substrate contact 3 is formed only in a region sandwiched by the dummy wirings 14 and 15, and the power voltage contact 30 is formed in a region other than the region that sandwiches the dummy wirings 14 and 15.

Figure 11A:
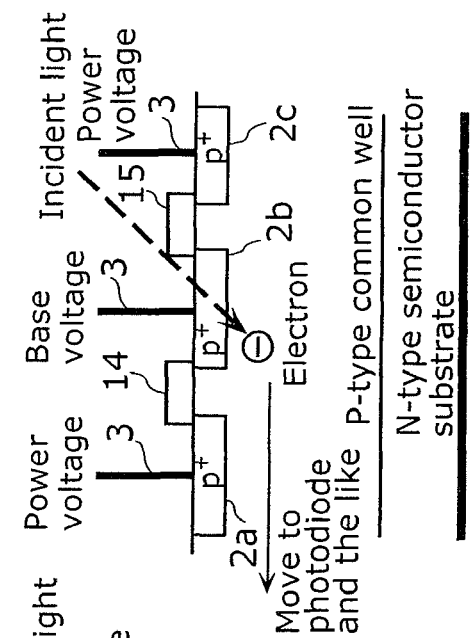
FIG. 11A is a schematic diagram illustrating a Section A-A' in FIG. 10.
Figure 11B:
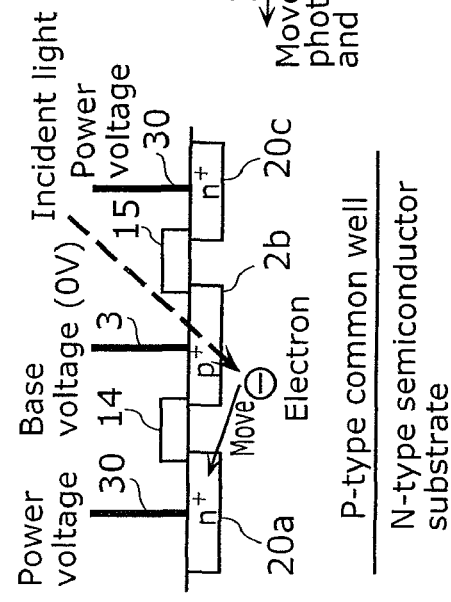
FIG. 11B is a schematic diagram illustrating a Section B-B' in FIG. 10.
Figure 11C:
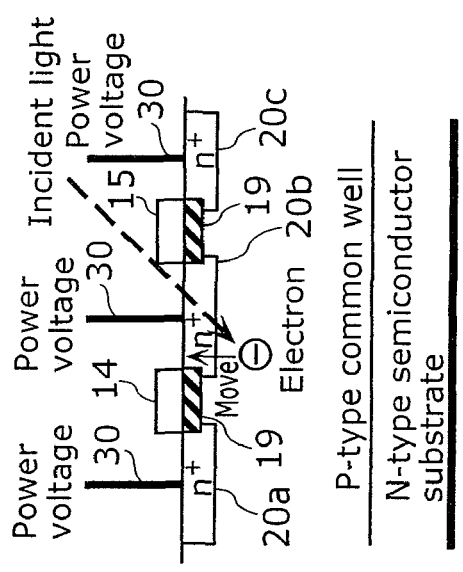
FIG. 11C is a schematic diagram illustrating a section in the case where portions of the semiconductor region in FIG. 11B are p+ type.

FIG. 11A to 11C illustrate sections of the solid-state imaging device according to the third embodiment of the present invention.

Note that FIG. 11A is a schematic diagram illustrating a Section A-A' in FIG. 10. FIG. 11B is a schematic diagram illustrating a Section B-B' in FIG. 10. FIG. 11C is a schematic diagram illustrating a section in the case where the semiconductor regions 20a and 20c in FIG. 11B are not n+ type but p+ type.

In FIG. 11C, when light enters, the electrons generated within a substrate move not to the p+ type regions 2a to 2c but to an adjacent photodiode. This causes a sensitivity difference with other photodiodes.

Thus, as illustrated in FIGS. 11A and 11B, the regions 20a and 20c are made n+ type regions in the solid-state imaging device according to the third embodiment of the present invention. With this, when light enters, it becomes possible that the electrons generated within a substrate move to the regions 20a and 20c, but not to a photodiode. This is because the regions 20a and 20c are connected to the power voltage.

As such, according to the third embodiment of the present invention, the p+ type semiconductor region 2b, two dummy wirings that are adjacent to both sides of the p+ type semiconductor region 2b, and two regions that are adjacent to opposite sides of the two dummy wirings and that sandwich the p+ type semiconductor region 2b are arranged. The conductivity type of the two regions is made n+ type. With this, it becomes possible to prevent a sensitivity difference from occurring, compared to cases where pixels are adjacent to other gate electrodes.

In other words, as illustrated in FIG. 11B, the conductivity type of the two regions that sandwich the two dummy wirings and the first semiconductor region 2b on which the substrate contact 3 is formed is made the n+ type, and the power voltage contacts 30 are provided on the n+ type regions. With this, it becomes possible to absorb electrons generated in the p+ type region under the substrate contact 2, in the power voltage contact 30.

Note that in the solid-state imaging device according to the third embodiment of the present invention, it is preferable that the structure of the first semiconductor region 2 on which the substrate contact 3 is formed corresponds to the structure of the contact/wiring of the second semiconductor region 20, and further, that the power voltage contact 17 is formed on the region 20b sandwiched by the dummy wirings 14 and 15 and on other regions 20a and 20c, respectively.

With this, it becomes possible to reduce variations in sensitivity occurring due to a difference in a reflection and a scattering of incident light that are caused by the different placement of a contact between the first semiconductor region 2 on which a substrate contact is formed and the second semiconductor region 20 on which the power voltage supplying contact is formed.

Furthermore, the solid-state imaging device in each of the aforementioned embodiments is installed in a digital camera and the like. Such digital camera includes: an optical system including a lens that leads incident light from a subject to an imaging phase of a solid-state imaging device; a control unit that controls a drive of the solid-state imaging device; and an image processing unit that performs various signal processing on an output signal of the solid-state imaging device.

Fourth Embodiment

In the fourth embodiment, an unit pixel includes: at least one photoelectric conversion region which converts light into a signal charge; the first semiconductor region that is formed on a common well and has a conductivity type (p+ type herein) identical to that of the common well; and a first contact electrically connected to the first semiconductor region. Furthermore, the unit pixel includes the source region 5 of the amplifying transistor, the common drain region 6, the third semiconductor region including the source region 7 of the reset transistor, and the contact electrically connected to the third semiconductor region (at least including the power voltage contact 17). The unit pixels are arranged in an array.

Furthermore, a signal reading line 14-1 in the detecting capacitor unit and the power voltage wiring 12 are arranged in the same shape and structure for each of the adjacent photodiodes 1.

Figure 12:
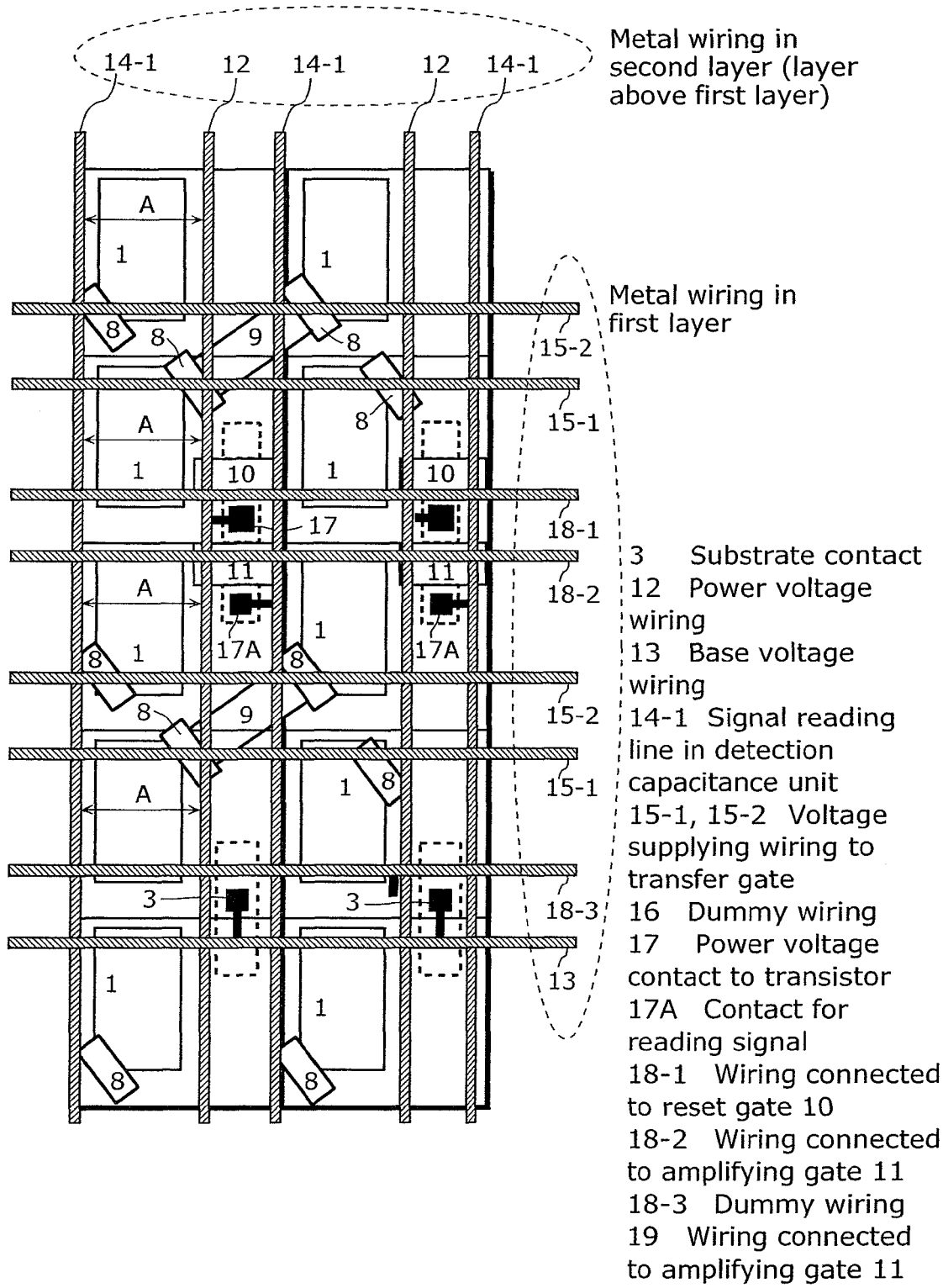
FIG. 12 illustrates a structure of main units in the solid-state imaging device according to the fourth embodiment.
Figure 13:
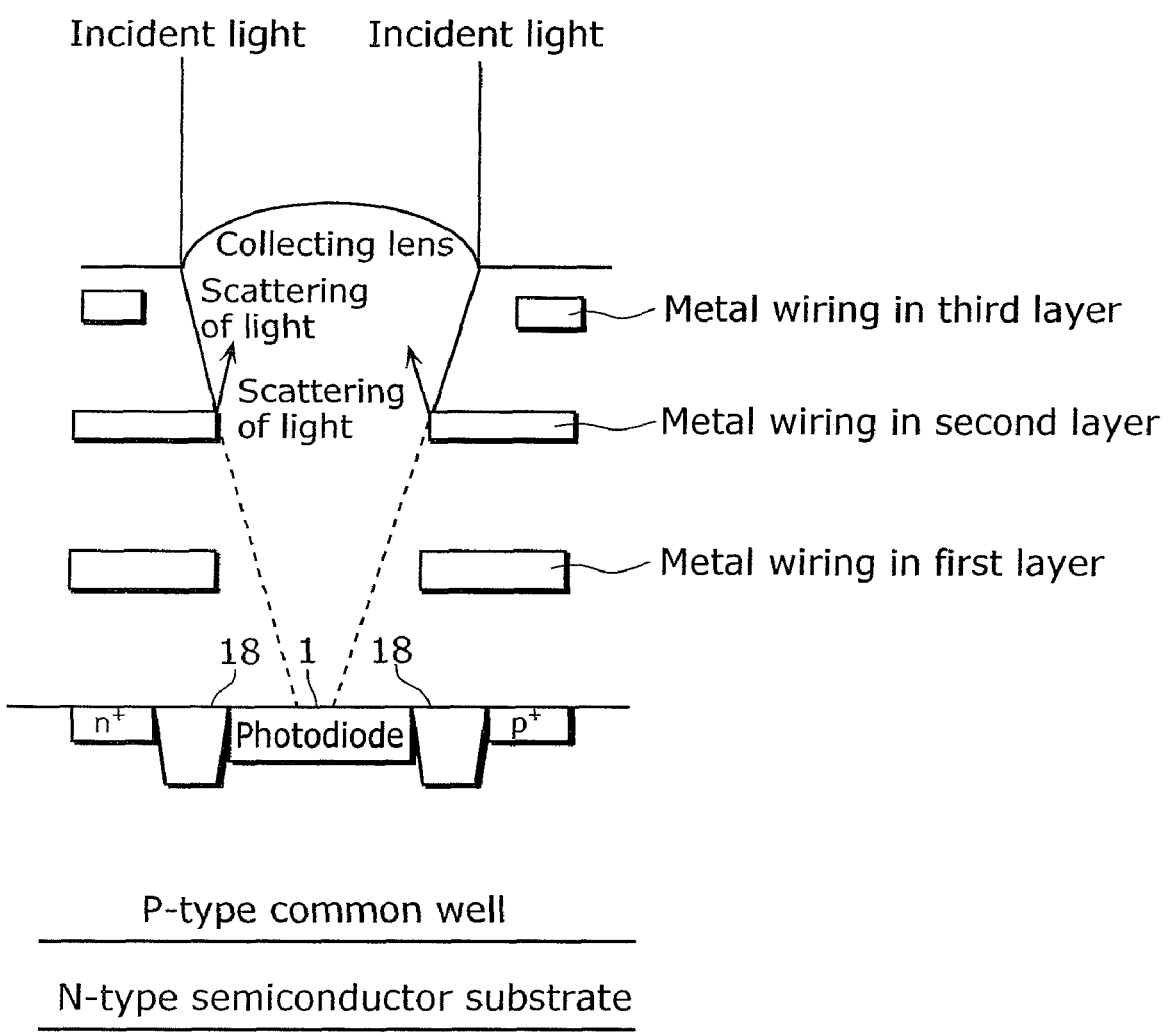
FIG. 13 illustrates a structure of main units in the solid-state imaging device according to the fourth embodiment.

FIGS. 12 and 13 illustrate respective structures of main units in the solid-state imaging device according to the fourth embodiment.

Since the same reference numerals are used in FIG. 12 for the same units as in FIG. 4, the description is omitted. As illustrated in FIG. 12, the signal reading line 14-1 in the detecting capacitor unit and the power voltage wiring 12 are arranged so as to sandwich the photodiodes 1. When turning on the transfer gate 8, the signal reading line 14-1 in the detecting capacitor unit is arranged so as to read a potential caused by a charge accumulated in the detecting capacitor unit 9. In other words, by electrically connecting the detecting capacitor unit 9 and the amplifying gate 11 to a contact (unillustrated) and a metal wiring (unillustrated), a charge signal that is accumulated in the detecting capacitor unit 9 through the amplifying gate 11 is amplified, and the signal is read through the signal reading line 14-1 of the detecting capacitor unit and though the signal reading contact 17A. Furthermore, the power voltage wiring 12 is arranged so as to supply the power voltage by electrically connecting to the power voltage contact 17 for a transistor and other contacts through a metal wiring.

Here, it becomes possible to reduce sensitivity variations by arranging, in the same structure, the signal reading line 14-1 in the detecting capacitor unit and the power voltage wiring 12 for the photodiodes 1. When the wiring structure is different, the variation occurs due to a difference in a reflection and a scattering of incident light for each of the photodiodes 1.

Furthermore, voltage supplying wirings 15-1 and 15-2 are arranged for applying a voltage to the transfer gates 8. Furthermore, in order to easily connect to the transfer gates through contacts, the voltage supplying wirings 15-1 and 15-2 for the transfer gate are formed in the lowest layer, rather than being formed in the second layer.

Furthermore, a wiring 18-1 connected to the reset gates 10 through contacts (unillustrated) and a wiring 18-2 connected to the amplifying gates 11 through contacts (unillustrated) are formed. Furthermore, the wirings 18-1 and 18-2 are formed as metal wirings in the lowest layer, as the wirings 15-1 and 15-2.

As described above, the fourth embodiment is characterized in that the signal reading line 14-1 in the detecting capacitor unit and the power voltage wiring 12 are formed as metal wirings in the second layer and a layer higher than the second layer.

Furthermore, in FIG. 13, when incident light from a collecting lens is focused on a portion close to a surface of the photodiode 1, since light is more exposed to metal wirings in the top layers, the wiring at the second layer rather than the first layer easily reflects or scatters light entering the photodiode 1. Furthermore, since the wiring in the second layer serves as connecting a wiring in the first layer to a wiring in the third or higher layers, a opening width of an opening on the photodiode 1 (the smallest width) or the area of the opening becomes the smallest opening width or the smallest area. Furthermore, the opening widths of the openings on the photodiodes 1 (opening widths A in FIG. 12) include the smallest width between the signal reading line 14-1 in the detecting capacitor unit and the power voltage wiring 12. When a shape of the metal wiring in the second layer is different for each of the photodiodes 1, a sensitivity difference occurs between the photodiodes 1. However, since the metal wirings in the second layer have the identical shape with respect to each of the adjacent photodiodes 1 in the fourth embodiment, it is possible to reduce the sensitivity variations.

As described above, the fourth embodiment is characterized in that a photodiode adjacent to the third semiconductor region and a photodiode adjacent to the fourth semiconductor region have the same structure in the shape of the metal wiring in the second layer.

Note that according to the fourth embodiment, the dummy wiring 18-3 is formed, without electrically connecting to other wirings and contacts, by forming the same shape of the metal wiring in the first layer with respect to each of the photodiodes 1, and thus, the sensitivity difference between the photodiodes can be reduced.

Furthermore, the sensitivity difference between the photodiodes can be further reduced by combining the fourth embodiment with one of the first to third embodiments.

More specifically, in the second semiconductor region that is formed on the common well and that has the same conductivity type (p+ type) as that of the common well, and in the fourth semiconductor region including the source region 5 of the amplifying transistor, the common drain region 6, and the source region 7 of the reset transistor, the first unit pixels in the first, second, and third embodiments are made the same structure in the shape of the metal wiring in the second layer.

Alternatively, in the second semiconductor region that is formed on the common well and that has the conductivity type (n+ type) opposite to that of the common well, and in the fourth semiconductor region including the source region 5 of the amplifying transistor, the common drain region 6, and the source region 7 of the reset transistor, the second unit pixel is made the same structure in the shape of the metal wiring in the second layer.

Alternatively, the sensitivity difference between the photodiodes can be further reduced by making the structure in the shape of the metal wiring in the second layer of the first unit pixel and second unit pixel identical to each other.

Common Elements in all of the Embodiments

The solid-state imaging device according to the first to fourth embodiments is installed in an imaging apparatus, such as a digital camera. Such digital camera includes: an optical system including a lens that leads incident light from a subject to an imaging phase of a solid-state imaging device; a control unit that controls a drive of the solid-state imaging device; and an image processing unit that performs various signal processing on an output signal of the solid-state imaging device.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can improve uniformity in sensitivity of each pixel while accelerating the driving speed of the device. Furthermore, the present invention is an effective technique for obtaining a solid-state imaging device that makes a high-definition image compatible with the high-speed of the device, and a technique that makes an imaging pixel finer and accelerates the driving speed of the device, in a digital still camera and a digital movie camera.

What is claimed is:

1. A solid-state imaging device comprising:
   unit pixels arranged in rows and columns on a semiconductor substrate; and
   a common well having a first conductivity type provided on the semiconductor substrate,
   wherein said unit pixels include two kinds of unit pixels including a first unit pixel and a second unit pixel that are provided on the common well and adjacent to each other,
   said first unit pixel includes:
   a first photoelectric conversion region which converts light into a signal charge and which has the first conductivity type;
   a first semiconductor region which is provided on the common well, which has the first conductivity type and which is separated from the first photoelectric conversion region by an element isolation region; and
   a first contact electrically connected to said first semiconductor region, and
   said second unit pixel includes:
   a second photoelectric conversion region which converts light into a signal charge and which has the first conductivity type;
   a second semiconductor region which is provided on the common well, which has a second conductivity type opposite to the first conductivity type, and which is separated from the second photoelectric conversion region by the element isolation region; and
   a second contact electrically connected to said second semiconductor region.

2. The solid-state imaging device according to claim 1,
   wherein said first contact is connected to a wiring having a base voltage of the common well, and
   said second contact is connected to a wiring having a positive voltage that is different from the base voltage.

3. The solid-state imaging device according to claim 1,
   wherein said first unit pixel and said second unit pixel are cyclically arranged in one of a column direction and a row direction.

4. The solid-state imaging device according to claim 1, wherein said first unit pixel and said second unit pixel are cyclically arranged in a column direction and in a row direction.

5. The solid-state imaging device according to claim 1,
   wherein at least one of said first unit pixel and said second unit pixel further includes:
   an amplifying transistor provided on the common well and separated from said first and said second photoelectric conversion regions, said amplifying transistor amplifying the signal charge; and
   a reset transistor provided on the common well and separated from said first and said second photoelectric conversion regions, said reset transistor resetting the signal charge, and the signal charge being converted by said photoelectric conversion region.

6. The solid-state imaging device according to claim 5,
   wherein said first unit pixel further includes a third photoelectric conversion region and a dummy gate electrode,
   said dummy gate electrode has a shape identical to a shape of one of a gate electrode of said amplifying transistor and a gate electrode of said reset transistor within said first unit pixel, and
   a relative position of said dummy gate electrode with respect to said third photoelectric conversion region within said first unit pixel is identical to a relative position of one of the gate electrode of said amplifying transistor and the gate electrode of said reset transistor with respect to said first photoelectric conversion region within said first unit pixel.

7. The solid-state imaging device according to claim 5,
   wherein said second unit pixel further includes a fourth photoelectric conversion region and a dummy gate electrode,
   said dummy gate electrode has a shape identical to a shape of one of a gate electrode of said amplifying transistor and a gate electrode of said reset transistor within said second unit pixel, and
   a relative position of said dummy gate electrode with respect to said fourth photoelectric conversion region within said second unit pixel is identical to a relative position of one of the gate electrode of said amplifying transistor and the gate electrode of said reset transistor with respect to said first photoelectric conversion region within said first unit pixel.

8. A camera including the solid-state imaging device according to claim 1.

9. The solid-state imaging device according to claim 1,
   wherein said first semiconductor region is a region in which p-type impurities are implanted, and
   said second semiconductor region is a region in which n-type impurities are implanted.

10. The solid-state imaging device according to claim 1, further comprising metal wiring layers,
    wherein at least one of said metal wiring layers includes a metal wiring arranged in an identical structure with respect to each of adjacent photoelectric conversion regions.

11. The solid-state imaging device according to claim 10, wherein said metal wiring included in at least one of said metal wiring layers includes a metal wiring for supplying a power voltage and a metal wiring for reading a signal charge.

12. The solid-state imaging device according to claim 11, wherein at least one of said metal wiring layers is a second layer or a layer higher than the second layer from a semiconductor substrate side.

13. The solid-state imaging device according to claim 10,
    wherein the unit pixels are cyclically arranged in one of a column direction and a row direction.

* * * * *